United States Patent
Lee (10) Patent No.: US 7,060,610 B2
(45) Date of Patent: Jun. 13, 2006

(54) METHOD FOR FORMING CONTACT IN SEMICONDUCTOR DEVICE

(75) Inventor: Min-Yong Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 276 days.

(21) Appl. No.: 10/819,189

(22) Filed: Apr. 7, 2004

(65) Prior Publication Data

US 2005/0142690 A1   Jun. 30, 2005

(30) Foreign Application Priority Data

Dec. 29, 2003   (KR) .................... 10-2003-0098520

(51) Int. Cl.
   *H01L 21/44*   (2006.01)
(52) U.S. Cl. ...................... 438/659; 257/599
(58) Field of Classification Search ............... 257/622, 257/624, 549, 599; 438/658–664, 433, 434, 438/524, 531
   See application file for complete search history.

(56) References Cited

U.S. PATENT DOCUMENTS 6,670,671 B1 * 12/2003 Sasago et al. ............... 257/319
6,888,196 B1 *  5/2005 Kobayashi .................. 257/330

FOREIGN PATENT DOCUMENTS

KR      1020040026332      3/2004

* cited by examiner

*Primary Examiner*—David Nelms
*Assistant Examiner*—Calvin Lee
(74) *Attorney, Agent, or Firm*—Mayer, Brown, Rowe & Maw LLP

(57) ABSTRACT

The present invention relates to a method for forming a contact in a semiconductor device. The method includes the steps of: forming a P-type source/drain junction in a substrate; forming an inter-layer insulation layer on the substrate; forming a contact hole exposing at least one portion of the P-type source/drain junction by etching the inter-layer insulation layer; forming a plug ion implantation region by implanting boron fluoride ions into the exposed portion of the P-type source/drain junction, the boron fluoride ion having the less bonding number of fluorine than $_{49}BF_2$; performing an activation annealing process for activating dopants implanted into the plug ion implantation region; and forming a contact connected to the P-type source/drain junction through the contact hole.

9 Claims, 7 Drawing Sheets

METHOD FOR FORMING CONTACT IN SEMICONDUCTOR DEVICE

FIELD OF THE INVENTION

The present invention relates to a method for fabricating a semiconductor device; and, more particularly, to a method for forming a contact in a semiconductor device.

DESCRIPTION OF RELATED ARTS

As large-scale of integration and high yields of semiconductor devices are essential assets for improving productivity of semiconductor devices, it has been required to secure a characteristic of a transistor for stable operation and minimize a resistance for high speed and low power consumption. Especially, it is critical for transistors in a peripheral region requiring a high operation speed to obtain an ultra shallow junction and a low contact resistance.

For instance, in a highly integrated memory device with a linewidth less than about 0.15 µm, a contact hole connecting a metal wire to a source/drain junction of a P-channel metal oxide semiconductor field effect transistor (PMOSFET) formed in a peripheral region has a very small size less than about 0.04 µm. Thus, after formation of the source/drain junction and the contact hole, an ion implantation process is additionally performed to decrease a contact resistance.

This additional ion implantation process is also referred as a plug ion implantation process. Generally, in a process for forming a metal contact in a semiconductor device, a contact hole is formed after a source/drain junction is formed. Then, prior to forming a metal wire, the above described additional ion implantation process is performed by implanting the same type of a dopant used in the source/drain junction to decrease a contact resistance of the source/drain junction. That is, the contact resistance is decreased by performing a rapid thermal annealing (RTA) process for activating the implanted dopants after the additional ion implantation process.

Figure 1A:
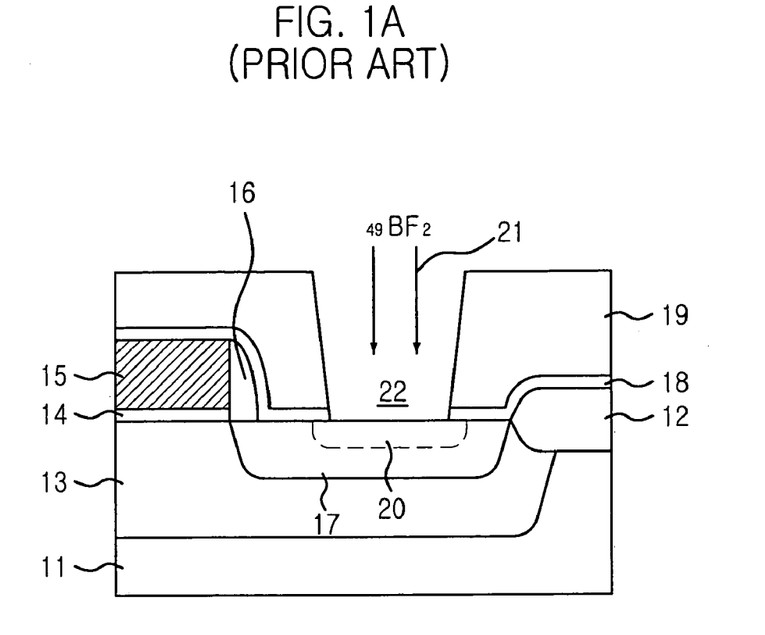
FIGS. 1A and 1B are cross-sectional views illustrating a conventional method for forming a contact in a semiconductor device.
Figure 1B:
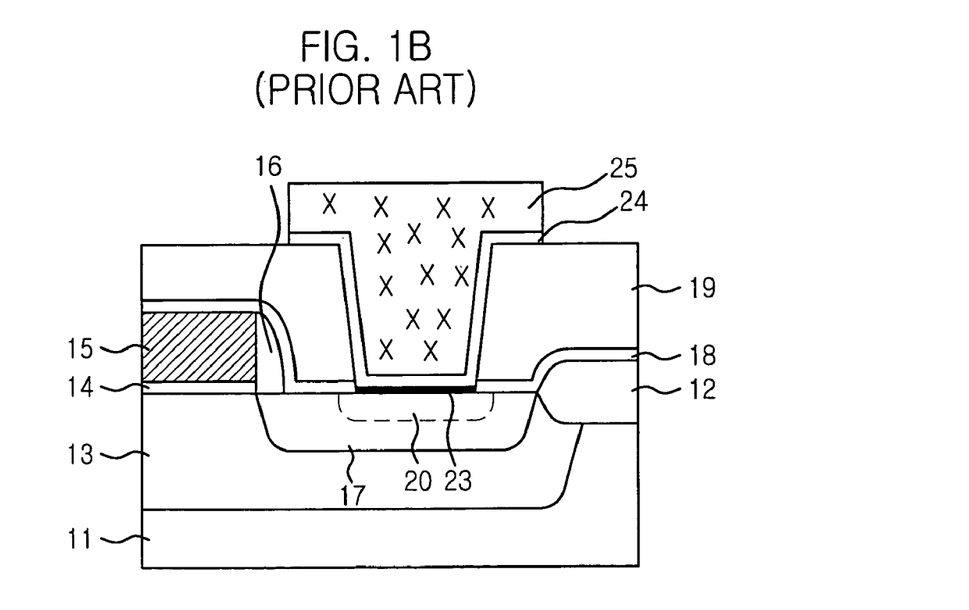

FIGS. 1A and 1B are cross-sectional views illustrating a conventional method for forming a contact of a PMOSFET.

Referring to FIG. 1A, a field oxide layer 12, which is a device isolation layer, is formed in a predetermined region of a substrate 11. Then, an N-type well 13 defining a PMOS region of the substrate 11 is formed. A gate structure including a gate insulation layer 14 and a gate electrode 15 is formed on a predetermined region of the substrate 11 through the use of the known method.

Afterwards, an insulation layer is deposited on an upper part of the substrate 11 and is then subjected to a blanket-etch back process to thereby form a spacer 16 on each sidewall of the gate electrode 15. A P-type source/drain junction 17 is formed by implanting P-type dopants such as boron ions and ions of a boron containing compound into a predetermined region of the substrate 11 disposed between the gate structure and the field oxide layer 12.

Next, an etch barrier layer 18 and an inter-layer insulation layer 19 are deposited on the above resulting substrate structure. Then, a contact mask (not shown) for exposing the P-type source/drain junction 17 is formed on the inter-layer insulation layer 19 through the use of a photolithography process. The inter-layer insulation layer 19 and the etch barrier layer 18 are etched with use of the contact mask as an etch mask. From this etching, a contact hole 22 is formed. At this time, a partial portion of a surface of the source/drain junction 17 or a surface of the substrate 11 can be damaged by the above etching process for forming the contact hole 22.

Subsequent to the contact hole formation, a plug ion implantation process is performed to alleviate the damage of the P-type source/drain junction 17 as simultaneously as to secure a contact resistance. At this time, boron difluoride ions ($_{49}BF_2^+$) 21 are used in the plug ion implantation process, which forms a plug ion implantation region 20. Thereafter, an annealing process, e.g., a rapid thermal annealing (RTA) process, is performed to activate the implanted P-type dopants. Hereinafter, this annealing process will be referred to as the activation annealing process.

Referring to FIG. 1B, the contact mask is removed, and a silicide layer 23, contacting the exposed P-type source/drain junction 17, and a diffusion barrier metal layer 24 are formed. Afterwards, a metal wire 25 is formed. For instance, the silicide layer 23 is a titanium silicide layer formed by depositing firstly a titanium layer and then making the titanium layer react with the substrate 11. Also, the diffusion barrier metal layer 24 is one of a titanium nitride layer and a stack layer of titanium and titanium nitride.

As described above, prior to forming the metal wire 25, the plug ion implantation process using the dopants having the same dopant type of the P-type source/drain junction 17 is performed to decrease a contact resistance of the P-type source/drain junction 17 and a RTA process proceeds thereafter.

However, a gradual decrease in the size of a semiconductor device conversely results in an increase in a contact resistance. Hence, the activation annealing process for activating a dopant should be performed at a higher temperature. In case of performing the activation annealing process at a temperature higher than a normally set temperature, a dopant is activated in proportion to a temperature, resulting in no decrease of the contact resistance and inactivation of the dopant, which subsequently increases the contact resistance and decreases a drain current.

In addition, performing the activation annealing process at a higher temperature may induce a lot of residual stress, and thus, resulting in a problem of degrading a refresh characteristic. Furthermore, parameters of transistors in a wafer should be uniform in a central region and an edge region of the wafer throughout. However, there may be a difficulty in obtaining parameter uniformity due to an edge effect caused by a RTA process.

SUMMARY OF THE INVENTION

It is, therefore, an object of the present invention to provide a method for forming a contact in a semiconductor device capable of preventing an increase in a contact resistance by a high thermal annealing process, deterioration of a refresh characteristic caused by a residual stress and a defect in uniformity caused by an edge effect.

In accordance with an aspect of the present invention, there is provided a method for forming a contact in a semiconductor device, including the steps of: forming a P-type source/drain junction in a substrate; forming an inter-layer insulation layer on the substrate; forming a contact hole exposing at least one portion of the P-type source/drain junction by etching the inter-layer insulation layer; forming a plug ion implantation region by implanting boron fluoride ions into the exposed portion of the P-type source/drain junction, the boron fluoride ion having the less bonding number of fluorine than $_{49}BF_2$; performing an activation annealing process for activating dopants implanted into the plug ion implantation region; and forming a contact connected to the P-type source/drain junction through the contact hole.

In accordance with another aspect of the present invention, there is also provided a method for forming a contact in a semiconductor device, including the steps of: forming a P-type source/drain junction on a substrate; forming an inter-layer insulation layer on the substrate; forming a contact hole exposing a partial portion of the P-type source/drain junction by etching the inter-layer insulation layer; forming a plug ion implantation region by implanting $_{30}BF$ ions into the exposed portion of the P-type source/drain region; performing an activation annealing process for activating dopants ion-implanted into the plug ion implantation region; and forming a contact connected to the P-type source/drain junction through the contact hole.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed description on a preferred embodiment of the present invention will be provided with reference to the accompanying drawings.

Figure 2:
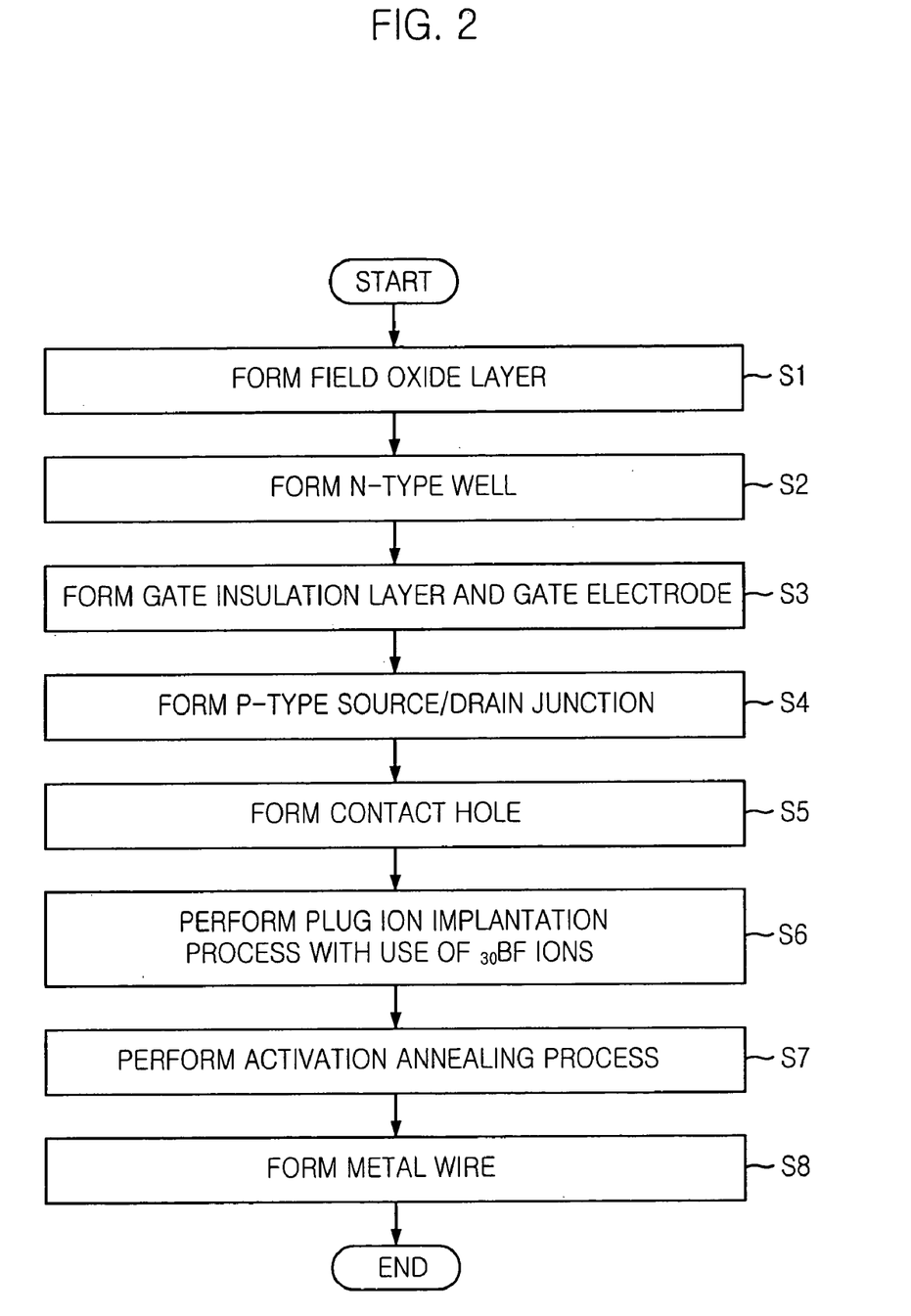
FIG. 2 is a flowchart for describing a method for forming a contact in a semiconductor device in accordance with a preferred embodiment of the present invention.

FIG. 2 is a flowchart for describing a method for forming a contact in a semiconductor device in accordance with a preferred embodiment of the present invention.

As shown, the above method includes the steps of forming a field oxide layer S1, forming an N-type well S2, forming a gate insulation layer and a gate electrode S3, forming a P-type source/drain junction S4, forming a contact hole S5, performing a plug ion implantation process with use of $_{30}BF$ ions S6, performing an activation annealing process S7, and forming a metal wire S8.

More particularly, in step S1, a shallow trench isolation (STI) method or a local oxidation of silicon (LOCOS) method is performed to form the field oxide layer. In step S2, the N-type well is formed by ion-implanting N-type dopants such as phosphorus (P). Also, in step S3, the gate insulation layer is one of a thermal oxide layer, an oxynitride layer, a high dielectric layer and a stack layer of an oxide layer and a high dielectric layer, while the gate electrode is one of a polysilicon layer, a stack layer of a polysilicon layer and a silicide layer, a stack layer of a polysilicon layer and a metal layer, a silicon-germanium layer, a stack layer of a silicon-germanium layer and a metal layer, and a metal layer.

Further to the description on the above steps, in step S4, one of $_{49}BF_2$ ions and $_{11}B$ ions are ion-implanted to form the P-type source/drain junction. Also, in step S5, an inter-layer insulation layer is etched to expose a partial portion of the P-type source/drain junction. In step S6, the plug ion implantation process proceeds by ion-implanting $_{30}BF$ ions into the exposed portion of the P-type source/drain junction. In step S7, the activation annealing process for electrically activating the dopants is performed after the plug ion implantation process. Also, there is an effect that about 40% of the fluorine ions used in the plug ion implantation process is discharged externally. Lastly, in step S8, the metal wire is connected to the P-type source/drain junction. In particular, the metal wire is formed by depositing and then patterning one of an aluminum layer, an aluminum alloyed layer, a tungsten layer, a copper layer and a copper alloyed layer.

Especially, the $_{30}BF$ ions used in the plug ion implantation process are extracted from a mass-analyzing magnet which only selects ions having a mass of about 30 amu during the extraction of ion beams with use of boron trifluoride ($BF_3$) gas. Also, compared with the bonding number of fluorine in the $_{49}BF_2$ ion, the $_{30}BF$ ion has the fluorine bonding number decreased by one half. Under the same dose of implanted ions, the $_{30}BF$ ions has a dose of implanted fluorine ions decreased by one-half compared with that of the $_{49}BF_2$ ions. Thus, it is possible to suppress generations of fluorine bubbles and precipitates of fluorine compounds. This suppression makes it possible to form a contact or a source/drain junction containing a low concentration of fluorine ions through the ion implantation of $_{30}BF$ ions. As a result, it is further possible to solve a difficulty in forming a silicide layer caused by a high concentration of fluorine ions and prevent non-uniformity in a contact resistance.

FIGS. 3A to 3D are cross-sectional views illustrating a method for forming a contact in a semiconductor device in accordance with the preferred embodiment of the present invention.

Figure 3A:
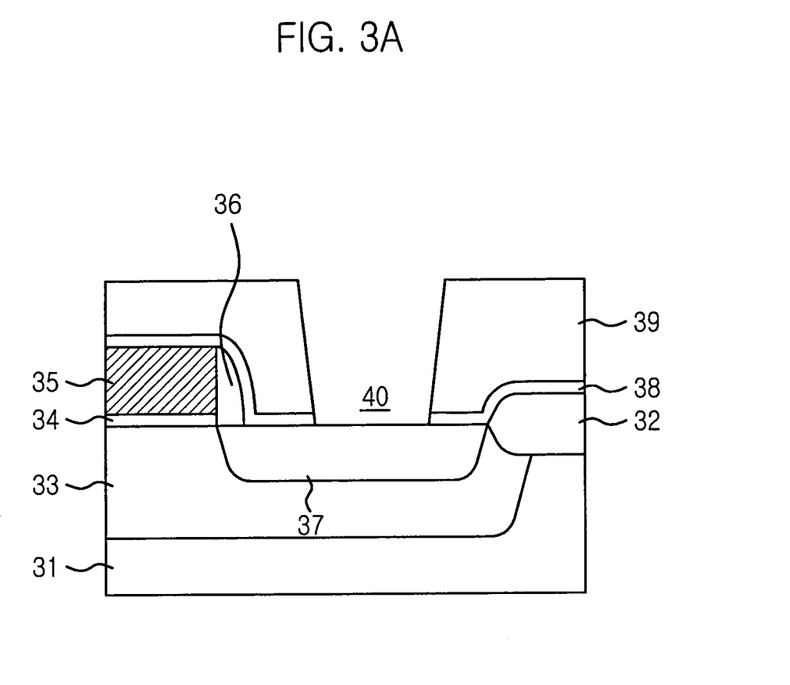
FIGS. 3A and 3D are cross-sectional views illustrating a method for forming a contact in a semiconductor device in accordance with the preferred embodiment of the present invention.

Referring to FIG. 3A, a field oxide layer 32, which is a device isolation layer, is formed in a predetermined region of a substrate 31 by performing one of a STI method and a LOCOS method. Then, an N-type well 33 is formed by ion-implanting N-type dopants such as phosphorus into the substrate 31, and a gate structure including a gate insulation layer 34 and a gate electrode 35 is formed on the substrate 31.

At this time, the gate insulation layer 34 may be one of a thermal oxide layer, an oxynitride layer, a high dielectric layer and a stack layer of an oxide layer and a high dielectric layer. Also, the gate electrode 35 may be one of a polysilicon layer, a polysilicon and silicide stacked layer, a polysilicon and metal stacked layer, a silicon-germanium layer, a silicon-germanium and metal stacked layer, and a metal layer. Also, a hard mask made of silicon nitride can be formed on an upper surface of the gate electrode 35.

Afterwards, an insulation layer is deposited on an upper part of the substrate 31 and is subjected to a blanket etch-back process to form a spacer 36 on sidewalls of the gate structure. At this time, the insulation layer for forming the spacer 36 is made of a material selected from a group consisting of silicon nitride, silicon oxide and a combination thereof. A P-type source/drain junction 37 is formed by ion-implanting P-type dopants such as $_{49}BF_2$ ions and $_{11}B$ ions into a predetermined region of the N-type well 33 of the substrate 31 disposed between the gate structure and the field oxide layer 32.

Next, an etch barrier layer 38 and an inter-layer insulation layer 39 are deposited on the substrate 31. At this time, the etch barrier layer 38 is a silicon nitride layer, while the inter-layer insulation layer 39 is a stack layer including such layers as a borophosphosilicate glass (BPSG) layer for gap-filling, a high density plasma (HDP) layer formed by a chemical vapor deposition (HDP) method and a low dielectric layer.

A contact mask (not shown) for exposing the P-type source/drain junction 37 is formed on the inter-layer insulation layer 39 through the conventional photolithography process. Then, the inter-layer insulation layer 39 and the etch barrier layer 38 are sequentially etched with use of the contact mask as an etch mask to form a contact hole 40. However, a portion of a surface of the P-type source/drain junction 37 can be damaged by the above etching process for forming the contact hole 40.

Figure 3B:
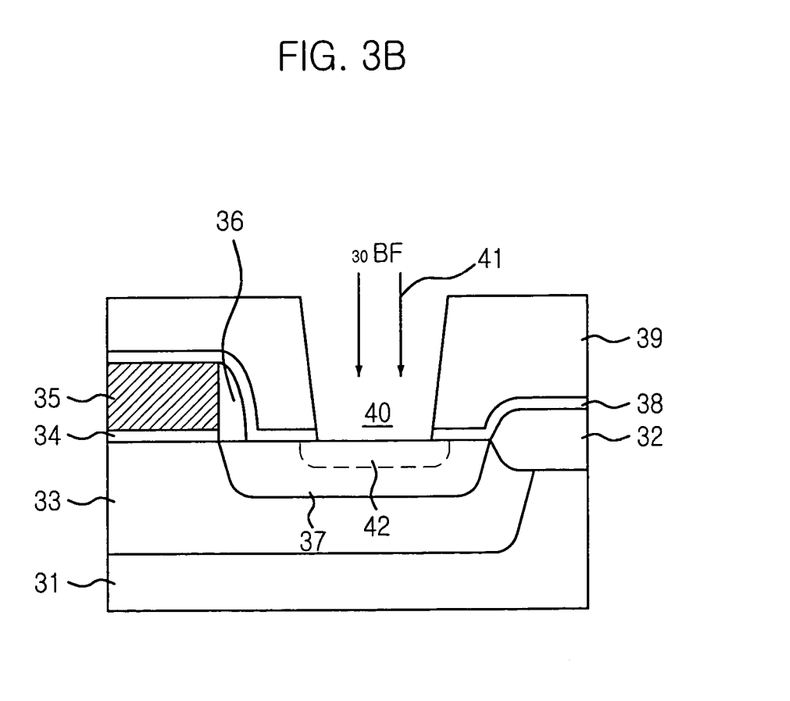

Referring to FIG. 3B, a plug ion implantation process is performed to alleviate the damaged portion of the P-type source/drain junction 37 as simultaneously as to secure an intended contact resistance. In more detail of the plug ion implantation process, $_{30}BF$ ions 41 with a dose ranging from about $1 \times 10^{15}$ ions/cm$^2$ to about $5 \times 10^{15}$ ions/cm$^2$ are implanted into the P-type source/drain junction 37. From this plug ion implantation process, a surface of the P-type source/drain junction 37 becomes amorphous. That is, a plug ion implantation region 42 is formed within the P-type source/drain junction 37. In addition, the plug ion implantation process proceeds by giving a tilt angle ranging from about 0 degree to about 60 degrees along with 0 to 4 times of rotation performed within a range of angle from about 0 degree to about 90 degrees.

At this time, a dose of the $_{30}BF$ ions 41 used in the plug ion implantation process is decreased by one half compared with that of the $_{49}BF_2$ ions since the $_{30}BF$ ion 41 has the bonding number of fluorine decreased by one half compared with that of the $_{49}BF_2$ ion. Therefore, the plug ion implantation region 42, formed by ion-implanting the $_{30}BF$ ions 41, is a shallow junction containing less amounts of fluorine. Also, even if ion implantation energy applied for the $_{30}BF$ ions 41 is decreased by approximately 61% of the ion implantation energy applied for the $_{49}BF_2$ ions, a projected range (Rp) of the $_{30}BF$ ions is same as that of the $_{49}BF_2$ ions. Herein, this decreased level of ion implantation energy is a ratio of molecular masses of BF and $BF_2$ having molecular masses of 30 amu and 49 amu, respectively.

Figure 3C:
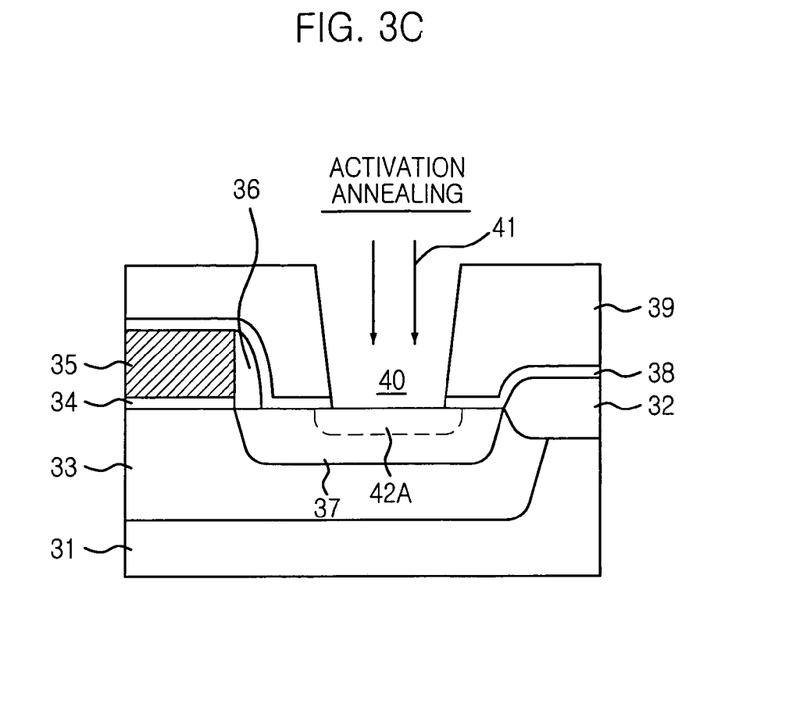

Referring to FIG. 3C, the contact mask is removed, and then, an activation annealing process for electrically activating the dopants ion-implanted in the plug ion implantation region 42 is performed. At this time, the activation annealing is performed at a temperature being lower than a melting point of silicon, which is about 1414° C., yet activating the dopants ion-implanted into the plug ion implantation region 42. Such temperature ranges from about 650° C. to about 800° C. Herein, the plug ion implantation region 42 activated by the activation annealing process is denoted with the reference number 42A. During the activation annealing process, about 40% of the ion-implanted fluorine within the plug ion implantation region 42 is discharged externally. As a result, it is possible to solve a difficulty in forming a silicide layer caused by fluorine compounds and thus, to obtain uniformity in a contact resistance.

Accordingly, the plug ion implantation region 42A is transformed into a layer of electrically activated P$^+$-type dopants as the ion-implanted dopants stably combine with silicon. That is, during the activation annealing process, the external discharge of fluorine takes place and boron and silicon stably combine with each other. The activation annealing process is performed by employing a method such as a rapid thermal annealing (RTA) process by flowing nitrogen gas, used as a purge gas, with a quantity ranging from about 1 slm to about 25 slm. Also, the activation annealing process has a heating rate ranging from about 10° C. per second to about 100° C. per second.

Figure 3D:
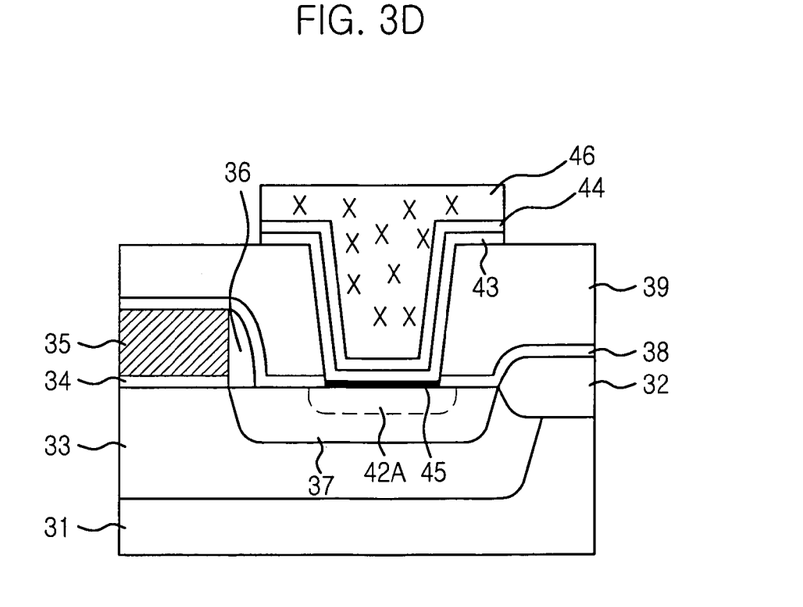

Referring to FIG. 3D, a metal layer 43 for forming a silicide layer and a diffusion barrier metal layer 44 are sequentially deposited on the above resulting structure including the inter-layer insulation layer 39 and the contact hole 40. Thereafter, a silicide layer 45 is formed through a reaction between silicon atoms of the plug ion implantation region 42A and a material constituting the metal layer 43. Herein, the metal layer 43 is made of a material selected from a group consisting of titanium, titanium silicide, cobalt, nickel and platinum. The diffusion barrier metal layer 44 for preventing a reciprocal reaction between a metal wire and the P-type source/drain junction 37 is made of a material selected from a group consisting of titanium nitride and tungsten nitride.

For instance, in case that the metal layer 43 and the diffusion barrier metal layer 44 are made of titanium and titanium nitride, respectively, the silicide layer 45 can be formed by performing the RTA process at a temperature ranging from about 650° C. to about 900° C. During the RTA process, silicon atoms of the plug ion implantation region 42A and titanium of the metal layer 43 react with each other to form a titanium-silicide layer. Such silicide layer 45 serves to make an ohmic contact for use in decreasing a contact resistance formed more easily.

Meanwhile, the titanium nitride serves a function as the diffusion barrier metal layer 44 and simultaneously prevents the titanium from being exposed to atmosphere, thereby preventing the formation of a native oxide layer caused by a prolonged exposure to atmosphere and protecting the titanium layer, which is the metal layer 43, from contamination.

After the formation of the silicide layer 45, another metal layer formed of one of aluminum, aluminum alloy, tungsten, copper, and copper alloy is deposited on the diffusion barrier metal layer 44 and is subjected to a patterning process for forming a metal wire 46. At this time, the diffusion barrier layer 44 and the metal layer 43 are simultaneously patterned.

In accordance with the preferred embodiment of the present invention, the P-type source/drain junction 37 is formed by implanting one of $_{49}BF_2$ ions and $_{11}B$ ions, while the plug ion implantation region 42 is formed by implanting $_{30}BF$ ions 41.

Figure 4A:
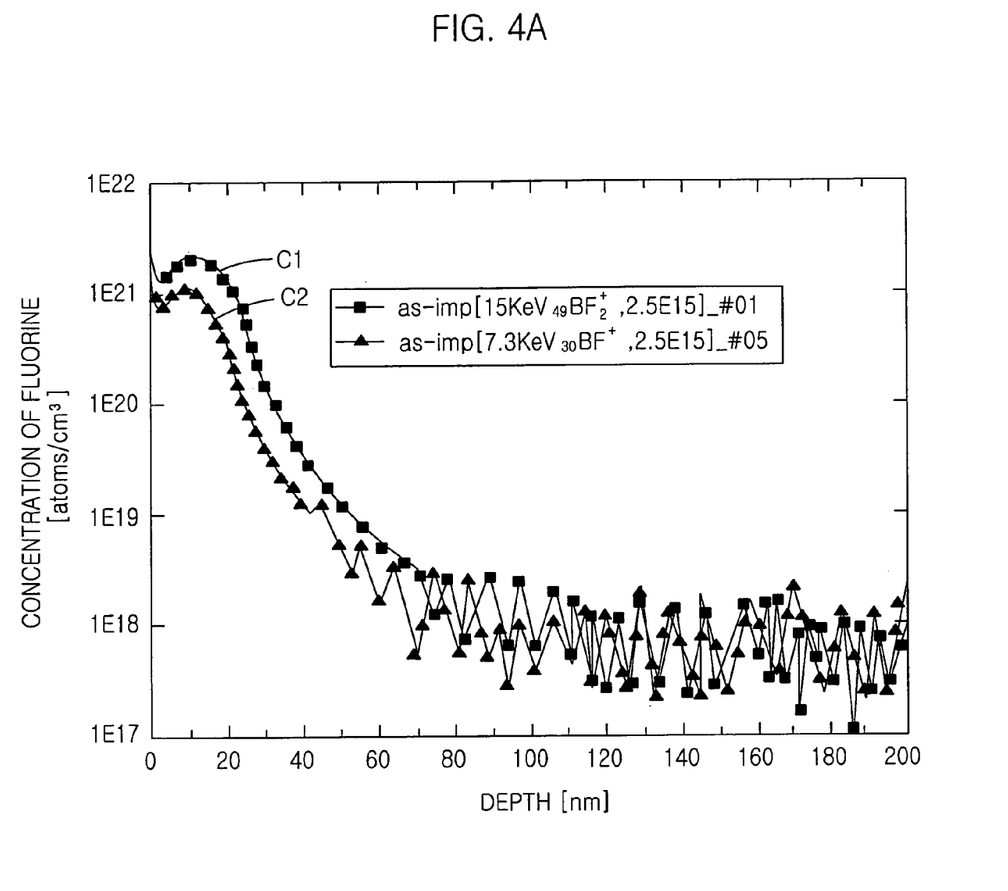
FIG. 4A is a graph showing respective profiles of fluorine concentration after plug ion implantation processes are performed by using boron difluoride ($_{49}BF_2$) ions and boron fluoride ($_{30}BF$) ions.
Figure 4B:
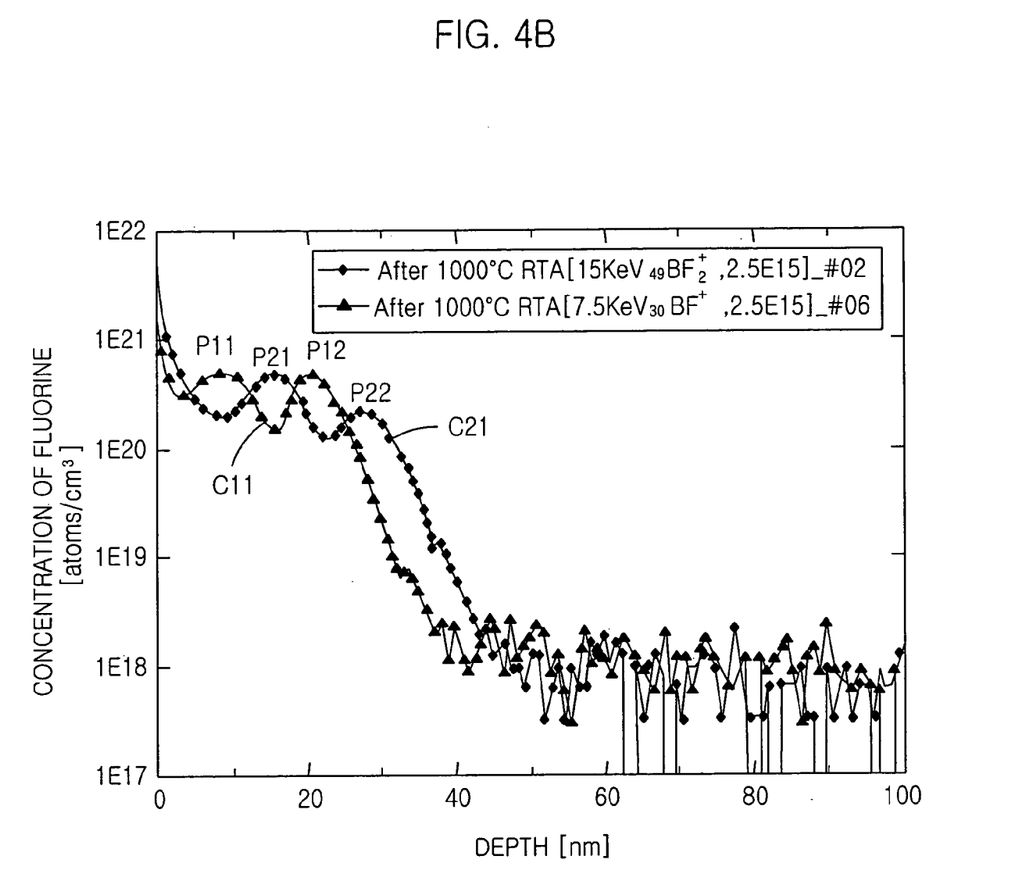
FIG. 4B is a graph showing respective profiles of fluorine concentration after an activation annealing process proceeded subsequent to the plug ion implantation of $_{49}BF_2$ ions and $_{30}BF$ ions.

FIG. 4A is a graph showing respective doping profiles of fluorine after plug ion implantation processes are performed by using $_{49}BF_2$ ions and $_{30}BF$ ions. FIG. 4B is a graph showing respective doping profiles of fluorine after an activation annealing process performed subsequent to the plug ion implantation of $_{49}BF_2$ ions and $_{30}BF$ ions.

Referring to FIG. 4A, the curve C1 expresses a doping profile of fluorine obtained after performing a plug ion implantation process using $_{49}BF_2$ ions as a dopant, while the curve C2 expresses a doping profile of fluorine after performing a plug ion implantation process using $_{30}BF$ ions as a dopant. Herein, the curve C1 is obtained by applying a dose of $_{49}BF_2$ ions in about $2.5 \times 10^{15}$ atoms/cm$^2$ and ion implantation energy of about 15 KeV. Meanwhile, the curve C2 is obtained by applying a dose of $_{30}BF$ ions in about $2.5 \times 10^{15}$ atoms/cm$^2$ and ion implantation energy of about 7.3 KeV. At this time, the reason for applying the decreased level of ion implantation energy for the plug ion implantation of the $_{30}BF$ ions is to obtain the same Rp as of the plug ion implantation of the $_{49}BF_2$ ions and thus, to ion-implant the same dose of boron. As shown in FIG. 4A, under the same depth, a concentration of fluorine obtained when the $_{30}BF$ ions are used in the plug ion implantation process is lower than that obtained when the $_{49}BF_2$ ions.

Referring to FIG. 4B, the curves C11 and C21 express respective doping profiles of fluorine obtained after an activation annealing process is performed at a temperature of about 1000° C. Both of the curves C11 and C21 have first peaks of fluorine P11 and P21 and second peaks of fluorine P12 and P22. At this time, in the curve C11, the first peak P11 and the second peak P12 are formed in a respective depth of about 10 nm and about 20 nm. In the curve C21, the first peak P21 and the second peak P22 are formed in a respective depth of about 17 nm and about 28 nm.

As shown in FIG. 4B, when the activation annealing process is performed at a temperature of about 1000° C. after the plug ion implantation of $_{30}BF$ ions, the curve C11 has the second peak P12 shown at a depth shifted towards a surface of a substrate. That is, in case of the plug ion implantation of $_{49}BF_2$ ions, the second peak P22 of the curve C21 is formed around a depth of about 28 nm. On the other hand, in case of the plug ion implantation of $_{30}BF$ ions, the second peak P12 of the curve C11 is formed around a depth of about 20 nm. This shift of the second peak of fluorine resulted from the use of $_{30}BF$ ions means that a layer formed by a residual defect becomes thinner. As a result, it is possible to form a subsequent silicide layer more easily, thereby improving a contact resistance.

Figure 5:
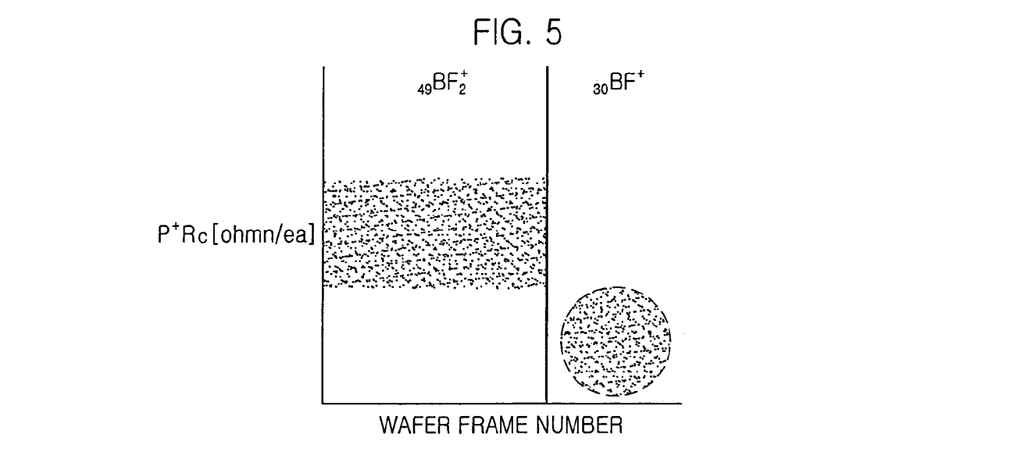
FIG. 5 is a graph showing a contact resistance distribution obtained under the use of $_{30}BF$ ions for a plug ion implantation process.

FIG. 5 is a graph showing a contact resistance distribution obtained when $_{30}BF$ ions are used in a plug ion implantation process. As shown, compared with a contact resistance when $_{49}BF_2$ ions are used, the use of $_{30}BF$ ions causes the contact resistance to be decreased by about 600 Ω per area. That is, compared with the use of $_{49}BF_2$ ions, the use of $_{30}BF$ ions provides an effect of decreasing the contact resistance by about 27% when the plug ion implantation process proceeds under the same Rp.

Figure 6:
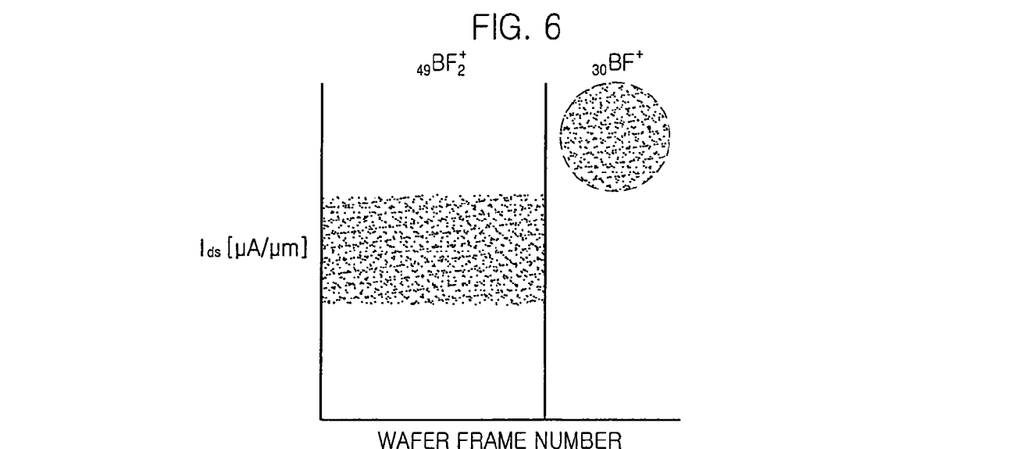
FIG. 6 is a graph showing a drain current characteristic when $_{30}BF$ ions are employed in a plug ion implantation process.

FIG. 6 is a graph showing a drain current characteristic when $_{30}BF$ ions are used in a plug ion implantation process. As shown, compared with a drain current when $_{49}BF_2$ ions are used, the use of $_{30}BF$ ions causes the drain current to be increased by about 10 μA.

Figure 7:
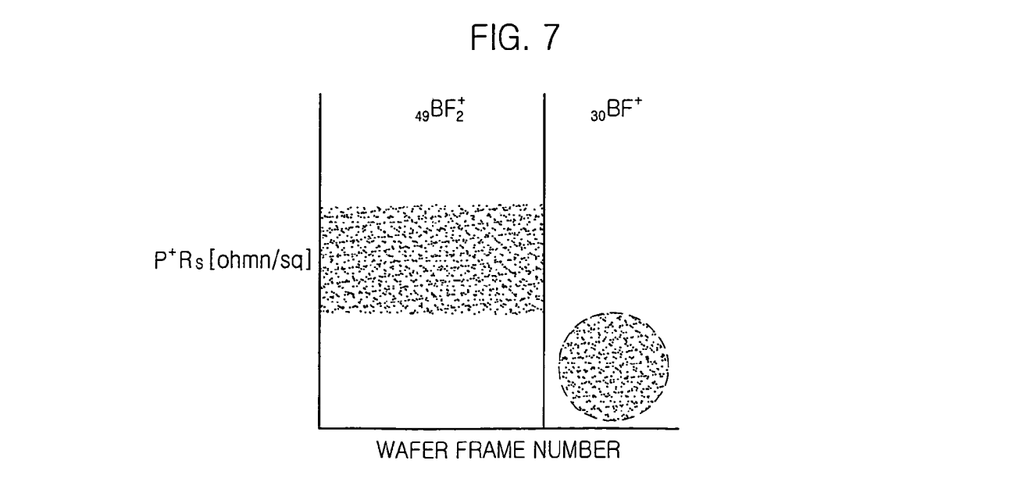
FIG. 7 is a graph showing a sheet resistance characteristic when $_{30}BF$ ions are employed in a plug ion implantation process.

FIG. 7 is a graph showing a characteristic of a sheet resistance when $_{30}BF$ ions are used in a plug ion implantation process. As shown, compared with a sheet resistance when $_{49}BF_2$ ions are used, the use of $_{30}BF$ ions causes the sheet resistance to be decreased by about 25 Ω for every wafer frame. That is, compared with the use of $_{49}BF_2$ ions, the use of $_{30}BF$ ions provides an effect of decreasing the sheet resistance by about 7% when the plug ion implantation process proceeds under the same Rp.

On the basis of the effects described in FIGS. 5 to 7, when $_{30}BF$ ions are employed in the plug ion implantation process, it is possible to obtain the same amount of boron used in the plug ion implantation process using $_{49}BF_2$ ions and to decrease an amount of fluorine within the plug ion implantation region by lowering the applied ion implantation energy as much as a decreased ratio in a molecular mass. As a result, generation of a residual defect can be diminished. Also, because of the lowered ion implantation energy, the second peak of the fluorine is discovered at a depth shifted towards the substrate, and thus, a layer with the residual defect becomes thinner. Accordingly, it is further possible to make improvements on a contact resistance, a drain current and a sheet resistance.

The present application contains subject matter related to the Korean patent application No. KR 2003-0098520, filed in the Korean Patent Office on Dec. 29, 2003, the entire contents of which being incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A method for forming a contact in a semiconductor device, comprising the steps of:
    forming a P-type source/drain junction in a substrate;
    forming an inter-layer insulation layer on the substrate;
    forming a contact hole exposing at least one portion of the P-type source/drain junction by etching the inter-layer insulation layer;
    forming a plug ion implantation region by implanting boron fluoride ions into the exposed portion of the P-type source/drain junction, the boron fluoride ion having the less bonding number of fluorine than $_{49}BF_2$;
    performing an activation annealing process for activating dopants implanted into the plug ion implantation region; and
    forming a contact connected to the P-type source/drain junction through the contact hole.

2. The method as recited in claim 1, wherein at the step of forming the plug ion implantation region, the boron fluoride ions are $_{30}BF$.

3. The method as recited in claim 2, wherein the $_{30}BF$ ions are ion-implanted by controlling a dose thereof to be within a range from approximately 100% to approximately 150% of that of $_{49}BF_2$ ions which are used in a conventional method.

4. The method as recited in claim 2, wherein the $_{30}BF$ ions are implanted by applying ion implantation energy decreased by about 30/49, which is a ratio of molecular mass decrement, with respect to the ion implantation energy applied when the $_{49}BF_2$ ions are used.

5. The method as recited in claim 1, wherein the activation annealing process adopts a rapid thermal annealing process and is performed at a temperature ranging from approximately 600° C. to approximately 800° C.

6. A method for forming a contact in a semiconductor device, comprising the steps of:
    forming a P-type source/drain junction on a substrate;
    forming an inter-layer insulation layer on the substrate;
    forming a contact hole exposing a partial portion of the P-type source/drain junction by etching the inter-layer insulation layer;
    forming a plug ion implantation region by implanting $_{30}BF$ ions into the exposed portion of the P-type source/drain region;

performing an activation annealing process for activating dopants ion-implanted into the plug ion implantation region; and forming a contact connected to the P-type source/drain junction through the contact hole.

7. The method as recited in claim 6, wherein at the step of forming the plug ion implantation region, the $_{30}$BF ions are implanted with a dose ranging from approximately $1 \times 10^{15}$ ions/cm$^2$ to approximately $5 \times 10^{15}$ ions/cm$^2$.

8. The method as recited in claim 6, wherein the activation annealing process adopts a rapid thermal annealing process and is performed at a temperature ranging from approximately 600° C. to approximately 800° C.

9. The method as recited in claim 8, wherein the activation annealing process adopting the rapid thermal annealing process proceeds by flowing a purge gas of nitrogen with a quantity ranging from approximately 1 slm to approximately 25 slm under a heating rate in a range from approximately 10° C. per second to approximately 100° C. per second.

* * * * *